(12) United States Patent
Schneider

(10) Patent No.: US 8,305,769 B2
(45) Date of Patent: Nov. 6, 2012

(54) SOLDERLESS ELECTRONIC COMPONENT OR CAPACITOR MOUNT ASSEMBLY

(75) Inventor: Richard Schneider, Livonia, MI (US)

(73) Assignee: Interplex Industries, Inc., College Point, NY (US)

( * ) Notice: Subject to any disclaimer, the term of this patent is extended or adjusted under 35 U.S.C. 154(b) by 337 days.

(21) Appl. No.: 12/622,899

(22) Filed: Nov. 20, 2009

(65) Prior Publication Data

US 2010/0124036 A1    May 20, 2010

Related U.S. Application Data

(60) Provisional application No. 61/116,547, filed on Nov. 20, 2008.

(51) Int. Cl.
*H05K 7/14* (2006.01)
(52) U.S. Cl. ....................................... 361/802
(58) Field of Classification Search .......... 361/802, 361/726, 748, 752, 784, 796, 801; 439/377; 379/330
See application file for complete search history.

(56) References Cited

U.S. PATENT DOCUMENTS

| 5,147,217 A * | 9/1992 | Neale et al. ............. 439/403 |
| 5,445,531 A * | 8/1995 | Billman et al. .......... 439/160 |
| 7,903,429 B2 * | 3/2011 | Fursich et al. ............ 361/802 |
| 2008/0298027 A1 * | 12/2008 | Muramatsu ............... 361/728 |

FOREIGN PATENT DOCUMENTS

| JP | 06-020746 | 1/1994 |
| JP | 09-162061 | 6/1997 |

* cited by examiner

*Primary Examiner* — Jeremy Norris
*Assistant Examiner* — Tremesha S Willis
(74) *Attorney, Agent, or Firm* — Weingarten, Schurgin, Gagnebin & Lebovici LLP

(57) ABSTRACT

A solderless electronic component or capacitor mount assembly including a housing having a base portion and a cover portion is disclosed. The cover portion and base portion being couplable to each other so as to secure a capacitor to the housing. The assembly further including at least one connector configured to couple the assembly to a printed circuit board, and at least one electrical contact configured to contact a respective at least one lead of the capacitor and provide an electrical connection for the capacitor.

20 Claims, 7 Drawing Sheets

SOLDERLESS ELECTRONIC COMPONENT OR CAPACITOR MOUNT ASSEMBLY

CROSS-REFERENCE TO PRIOR APPLICATIONS

This application claims the benefit of U.S. Provisional Patent Application No. 61/116,547, filed Nov. 20, 2008, which is hereby incorporated by reference in its entirety.

FIELD OF INVENTION

The present invention generally relates to assemblies and connectors. Specifically, the present invention relates to a solderless mount assembly for capacitors.

BACKGROUND OF THE INVENTION

Large capacitors, such as high-value electrolytic capacitors, are widely used in various applications throughout industry. As technology has developed, the number of applications implementing large capacitors has grown. Various industries have experienced significant growth in utilizing high-value capacitors. However, many of the industries that utilize high-value capacitors implement the capacitors in circuits that are exposed to vibrations and shock. A sampling of such industries includes the automotive industry, the power generation industry, airplane industry, manufacturing, etc.

In addition to high-stress applications, high-value capacitors are traditionally difficult to mount. The large package size of high-value capacitors introduces added considerations and complications not associated with smaller electronic components. First, assembling circuit boards with high-value capacitors often requires at least some hand assembly. The large high-value capacitors are typically soldered by hand onto the printed circuit board ("PCB"). Hand soldering is typically time consuming and expensive, yielding inconsistent results. In addition, improper or unskillful soldering results in unreliable solder joints, such as cold solder joints that are prone to failure.

Furthermore, the large size package of the high-value capacitors introduces added stress and strain on the capacitor's leads. These mechanical considerations are typically not an issue for smaller electronic components. The many applications that expose electrical components to significant vibrations and shock are magnified because of the large package size. Accordingly, large packaged high-value capacitors in many applications are exposed to vibrations and shock. This results in significant stress and strain to the capacitors themselves and the structures through which they are attached. Thus, the solder joints and mounts attaching these capacitors to printed circuit boards in such applications experience significant stress. Furthermore, traditional hand-soldered, large-packaged, high-value capacitors in these types of applications have difficulty withstanding and enduring such mechanical strains.

SUMMARY OF THE INVENTION

The present invention is directed to an electrical component mounting assembly. The mounting assembly provides a solderless, small foot-print, secure, durable, and cost-effective mounting assembly for electronic components such as capacitors.

An exemplary embodiment of an electrical component mounting assembly according to the present invention provides an electrical component mounting assembly including a housing having a base portion and a cover portion. The cover portion and base portion are coupled to each other so as to secure an electronic component such as a capacitor to the housing. The assembly further includes at least one connector configured to couple the assembly to a printed circuit board, and electrical contacts configured to contact respective leads of the capacitor and provide an electrical connection for the capacitor.

Another exemplary embodiment of a solderless electronic component or capacitor mount assembly according to the present invention provides a solderless capacitor mount assembly including a single-piece housing having a base portion and a cover portion articulated about a hinge. The assembly further includes at least one releasably engaging locking mechanism configured to couple the cover portion and the base portion, at least one connector configured to couple the assembly to a printed circuit board, and electrical contacts configured to contact respective leads of the capacitor and provide an electrical connection for the capacitor.

BRIEF DESCRIPTION OF THE DRAWINGS

The present invention will be more readily understood from the detailed description of exemplary embodiments presented below considered in conjunction with the accompanying drawings, in which.

DETAILED DESCRIPTION

The present invention is directed to a solderless mounting assembly for an electronic component such as a capacitor. While the embodiments described herein are described in connection with a capacitor, it should be understood that the present invention may be used in connection other electronic components in general, and is not limited to capacitors in specific.

Figure 1A:
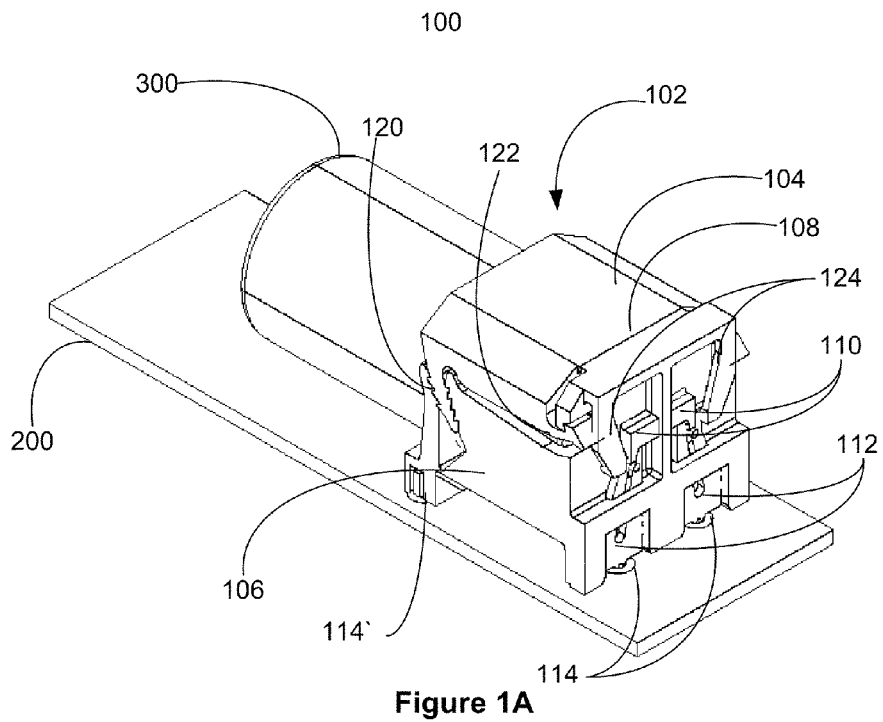
FIG. 1A is a perspective illustration of a solderless capacitor mounting assembly in accordance with an embodiment of the present invention.
Figure 1B:
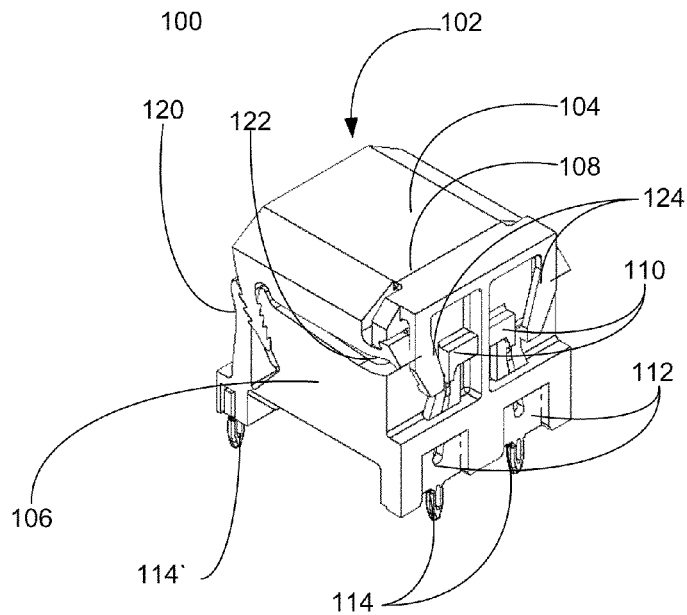
FIG. 1B is a perspective illustration of a solderless capacitor mounting assembly in a closed position in accordance with an embodiment of the present invention.

FIGS. 1A and 1B are perspective views of a solderless mounting assembly 100 for a capacitor according to an embodiment of the present invention. FIG. 1A shows a capacitor 300 installed in the assembly 100, and FIG. 1B shows the assembly 100 without a capacitor. The solderless mounting assembly 100 provides a secure mount for attaching the capacitor 300, such as a high-value electrolytic capacitor, to a printed circuit board ("PCB") 200 without soldering the capacitor 300 to the assembly 100, and also without soldering the assembly 100 to the PCB 200. As shown in FIGS. 1A and 1B, the assembly 100 includes a housing 102, electrical contacts 112, and connectors 114 and 114'. The housing 102 is preferably a single-piece molded plastic unit, however, the housing 102 may also be a multiple component assembly made from any insulating material that can be coupled together.

Figure 3A:
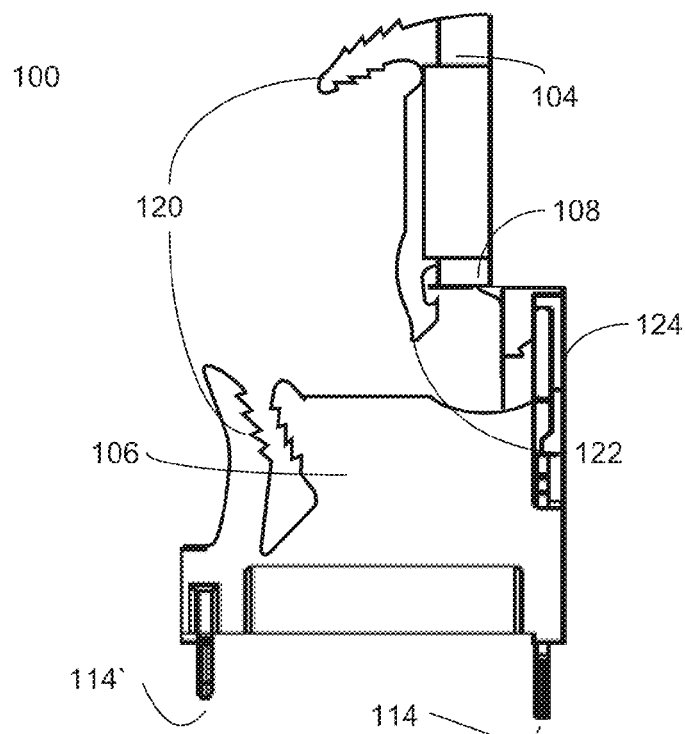
FIG. 3A is a side view of a solderless capacitor mounting assembly in accordance with an embodiment of the present invention.

The housing 102 includes a cover portion 104 that can be articulated about a hinge 108 between an open position (as shown in FIG. 3A), and a closed position, as shown in FIGS. 1A and 1B. In an embodiment where the housing 102 is a multiple piece assembly, the various pieces of the housing 102 are coupled together and without using a hinge. Optionally, the assembly 100 may include stops or some other stopping mechanism to limit the articulation of the cover portion 104. The open position allows the capacitor 300 to be installed into the assembly 100, and the closed position secures the capacitor 300 to the assembly 100. In the closed position, the cover portion 104 and a base portion 106 are coupled to each other via locking mechanisms 120 and 122. The locking mechanisms 120 and 122 provide releasable engagement of the cover portion 104 and the base portion 106. In an alternative embodiment, the locking mechanisms 120 and 122 may permanently secure the capacitor 300 to the assembly 100. This may be accomplished using welds or other types of non-releasable assembly. In an embodiment where the housing 102 is a multiple piece assembly, the locking mechanisms 120 and 122 provide the mechanisms via which the multiple pieces are coupled together. The locking mechanisms 120 and 122 may include a dual-faced ratchet, a locking cam, snap fit components, welds, or any other mechanism through which the cover portion 104 and the base portion 106 may be coupled to each other via releasable engagement.

The housing 102 further includes positive stops 110 for securing leads of the capacitor 300. The positive stops 110 provide a normal force on the capacitor leads opposite to the force exerted on the capacitor leads by the electrical contacts 112. The positive stops 110 and the electrical contacts 112 secure and seat the capacitor leads. In addition to securing the capacitor leads, the electrical contacts 112 make solderless electrical contact with the capacitor leads and provide an electrical connection between the capacitor leads and the PCB 200. The electrical connection is provided via at least one of the connectors 114. Accordingly, at least one of the connectors 114, in conjunction with the electrical contacts 112, provides electrical connections between the PCB 200 and the capacitor 300. Additionally, the connectors 114 and 114' secure the assembly 100 to the PCB 200. Preferably, the connectors 114 provide mechanical and electrical connections from the assembly 100 to the PCB 200, and the connectors 114' provide a mechanical connection to the PCB 200. The connectors 114 and 114' are preferably press-fit or compliant connectors, but may be any type of mounting mechanism that relies on a frictional engagement with the PCB 200. Optionally, the connectors 114 and 114' may be soldered, welded, etc. to the PCB 200 to further secure the assembly 100 to the PCB 200.

Figure 2:
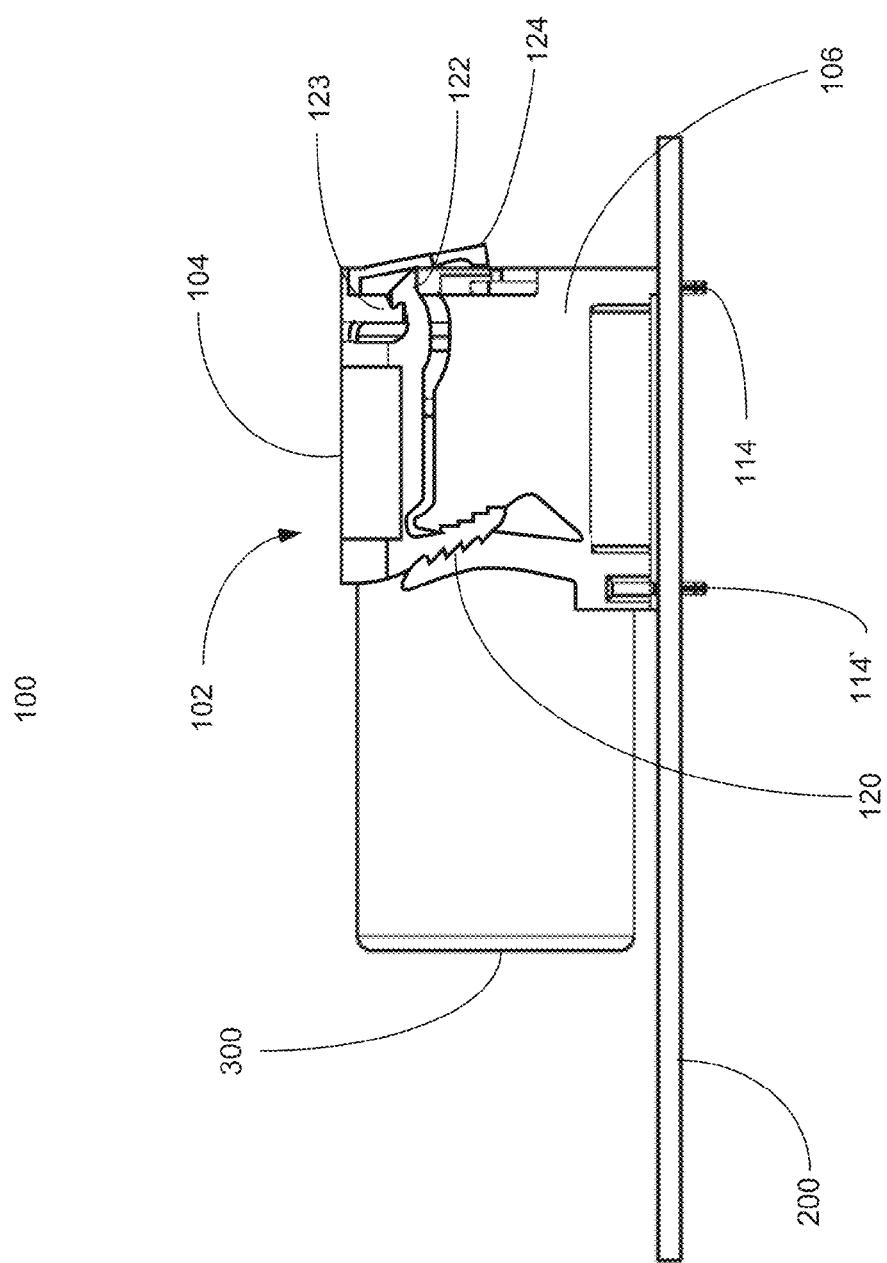
FIG. 2 is a side view of a solderless capacitor mounting assembly in accordance with an embodiment of the present invention.

The housing 102 also includes flexible arms 124. The flexible arms 124 may be an integral part of the housing 102, or may be a detachable component. The flexible arms 124 are located at the rear of the assembly 100. The flexible arms 124 include two positions, a locked and an unlocked position, and cooperate with the cover portion 104 and interact with the movement of the electrical contacts 112. When the cover portion 104 is in an open position, the flexible arms 124 are in a locked position, (e.g., flush with the rear of the housing 102 as seen in FIG. 3A). In this position, the flexible arms 124 are disposed in the path of the electrical contacts 112, and "lock" the electrical contacts 112 in place, preventing the electrical contacts 112 from moving into the position where they contact the leads of the capacitor 300. When the cover portion 104 is closed and coupled to the base portion 106, the flexible arms 124 are in an unlocked position, pushed out of the path of the electrical contacts 112 (e.g., pushed out as seen in FIG. 2), "unlocking" the electrical contacts 112. This allows the electrical contacts 112 to be pushed up into position to contact the capacitor leads.

FIG. 2 is a side view of the solderless mounting assembly 100 for a capacitor according to an embodiment of the present invention. As shown in FIG. 2, the cover portion 104 and the base portion 106 are coupled to each other via locking mechanisms 120 and 122, securing the capacitor 300 within the housing 102 of the assembly 100. Further, the flexible arms 124 are shown in a pushed out position allowing the electrical contacts 112 to be moved into a position to make contact with the capacitor leads. The assembly 100 is again shown to be mounted to the PCB 200 via connectors 114 and 114'. FIG. 2 shows the structure of the locking mechanisms 120 and 122. The locking mechanisms 120 and 122 provide releasably engaged coupling of the cover portion 104 and the base portion 106 in securing the capacitor 300 to the assembly 100. As shown in FIG. 2, the locking mechanism 120 may include releasably engageable teeth included on both the cover portion 104 and the base portion 106, forming a dual-faced ratchet. Additionally, the locking mechanism 122 may include a locking cam located on the cover portion 104. The locking cam may be configured to engage with a recess 123 included on the base portion 106. Although the locking mechanisms 120 and 122 are shown to be a dual-faced ratchet and a locking cam, respectively, the locking mechanisms 120 and 122 are not limited to these specific types of mechanisms and can be any type of locking mechanism that can secure the cover portion 104 to the base portion 106.

Figure 3B:
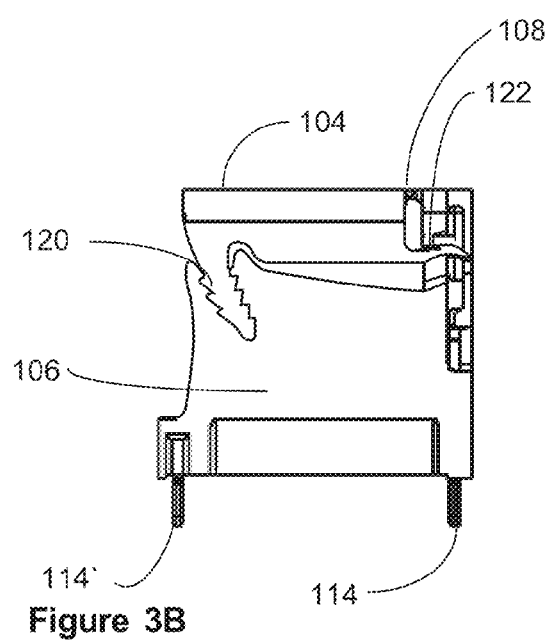
FIG. 3B is a side view of a solderless capacitor mounting assembly in accordance with an embodiment of the present invention.

FIGS. 3A and 3B are side views of the solderless mounting assembly 100 for a capacitor according to an embodiment of the present invention. FIGS. 3A and 3B show the assembly 100 without a capacitor. FIG. 3A shows the assembly 100 in an open position, where the cover portion 104 and the base portion 106 are not coupled to each other and the flexible arms 124 are in the locked, flush position to prevent movement of the electrical contact. The open position permits a capacitor to be installed into the assembly 100. As shown in FIGS. 3A and 3B, the cover portion 104 is articulated about the hinge 108. In an exemplary embodiment, the hinge 108 is a living hinge. However, the hinge 108 can be any mechanism about which the cover portion 104 can articulate or rotate. The hinge 108 allows the cover portion 104 to be coupled with the base portion 106 through a lever action, and be releasably engaged with the base portion 106 via the locking mechanisms 120 and 122. The lever action provides a low assembly force in coupling the cover portion 104 with the base portion 106, and the locking mechanisms 120 and 122 exert high hold forces in securing the capacitor. In an exemplary embodiment, the hold force securing the capacitor is six times the assembly force applied to couple the cover portion 104 and the base portion 106 to each other.

Figure 4:
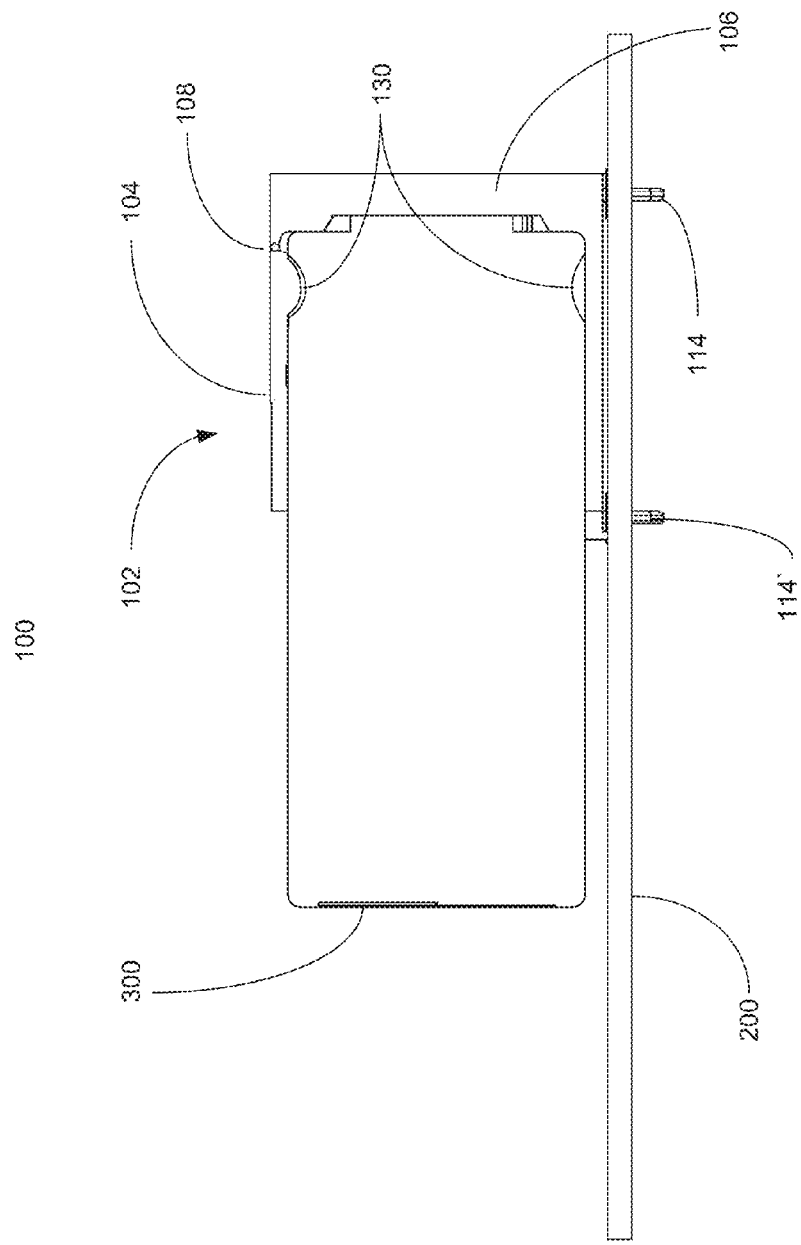
FIG. 4 is a cross-sectional illustration of a solderless capacitor mounting assembly in accordance with an embodiment of the present invention.

FIG. 4 is a cross-sectional view of the assembly 100 as shown in FIG. 2 showing details of the interior of the housing 102 not visible in the other Figures. As shown in FIG. 4, the cover portion 104 of the housing 102 and the base portion 106 are coupled to each other in securing the capacitor 300 to the housing 102. Further, the assembly 100 is attached to the PCB 200 via connectors 114 and 114'. Additionally, the inner surfaces of the cover portion 104 and base portion 106 include at least one projection 130. The at least one projection 130 is shaped to be complementary to grooves typically included in the packages of many large electrolytic capacitors. The complementary design of the projection 130 allows the projection 130 to mate with the grooves of the capacitor package, further securing and stabilizing the capacitor 300 within the assembly 100. Optionally, the housing may include an additional securing feature to further secure the capacitor 130 within the housing 102. This securing feature may include projections, or ribs, etc., or a material having a higher frictional coefficient molded into the housing 102. Alternatively, the securing feature may include a separate piece of material having a higher frictional coefficient that can be coupled to the interior of the housing. This securing feature further secures the capacitor by increasing the frictional and compression forces, further securing the capacitor within the assembly 100.

Figure 5:
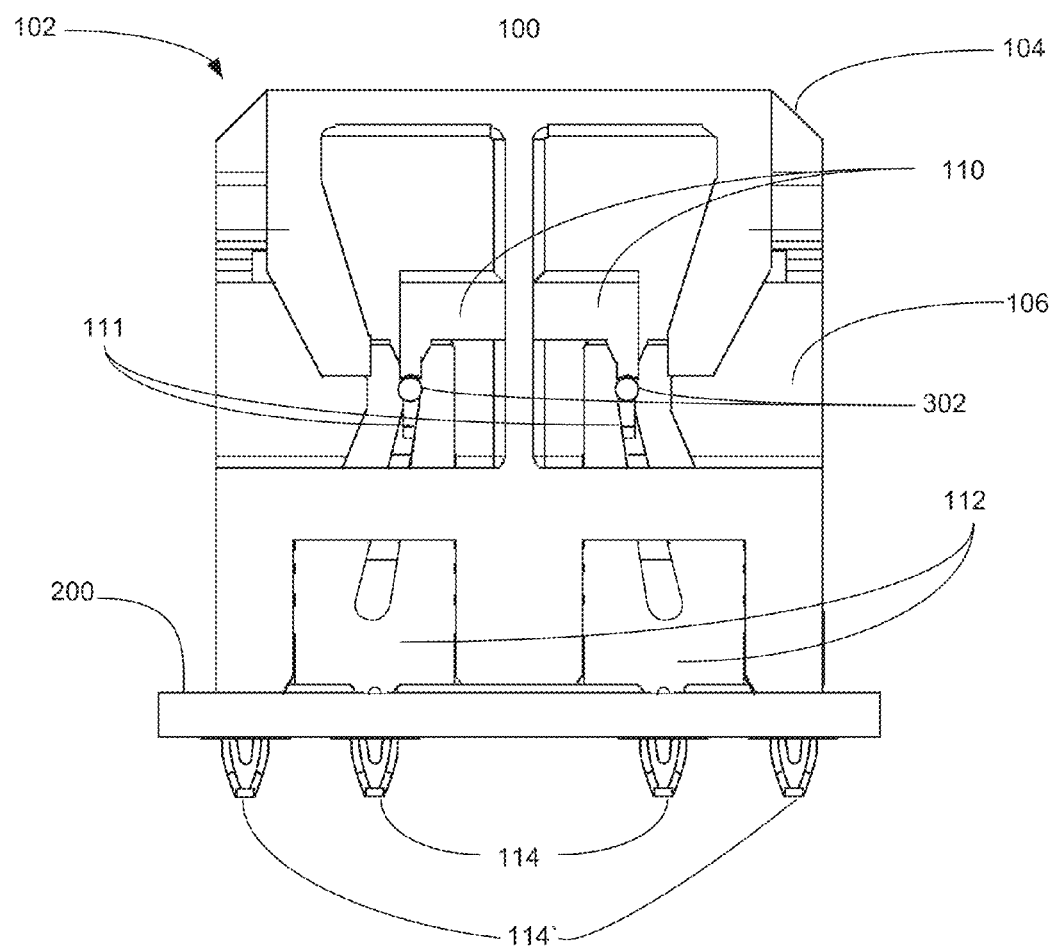
FIG. 5 is a rear view of a solderless capacitor mounting assembly in accordance with an embodiment of the present invention.

FIG. 5 is a rear view of the solderless mounting assembly 100 according to an embodiment of the present invention. FIG. 5 shows capacitor leads 302 secured to the assembly 100 via electrical contacts 112 and positive stops 110. The electrical contacts 112 are preferably fork-type electrical contacts having dual-tines, with a gap between the tines that is smaller than the diameter of the capacitor leads 302. Alternatively, the electrical contacts 112 can be any type of electrical contact that provides a securing force on the capacitor leads 302, and a reliable electrical contact to the capacitor leads 302. In an exemplary embodiment of the assembly 100 having dual-tine fork-type electrical contacts 112, securing the capacitor 300 to the assembly 100 is a multi-step process. First, the capacitor 300 is placed within the housing 102 and the capacitor leads 302 are inserted through holes located at the rear of the housing 102. Subsequently, the cover portion 104 is closed and coupled to the base portion 106. Closing the cover portion 104 secures the capacitor 300 within the housing 102, and "unlocks" the flexible arms 124. Thus, the electrical contacts 112 are free to be pushed up to the position as shown in FIG. 5, contacting the capacitor leads 302 and exerting an upward force on the capacitor leads 302. This upward force is opposed by a normal force provided by the positive stops 110. These opposing forces seat and secure the capacitor leads 302 within the housing 102. After the electrical contacts 112 have been mated with the capacitor leads 302, the assembly 100 is mounted onto the PCB 200 via connectors 114 and 114'. The mounting of the assembly 100 to the PCB 200 via connectors 114 and 114' maintains the upward force that the electrical contacts 112 exert on the capacitor leads 302, maintaining electrical contact.

Optionally, the housing 102 may also include lower positive stops 111 to further secure the capacitor leads 302 within the housing. These optional lower positive stops 111 are dimensioned to have a width smaller than the diameter of the capacitor leads 302. This allows the lower positive stop 111 to fit within the gap between the tines of the electrical contacts 112. Further, the gap between the tines of the electrical contacts 112 can be dimensioned (e.g., by narrowing or tapering) so that the electrical contacts 112 exerts an upward force on the lower positive stop 111 when the electrical contacts 112 are pushed up to the position shown in FIG. 5. In addition to the mechanical functionality, the electrical contacts 112 provide an electrical connection to at least one of the connectors 114, which provides an electrical connection to the PCB 200.

Figure 6:
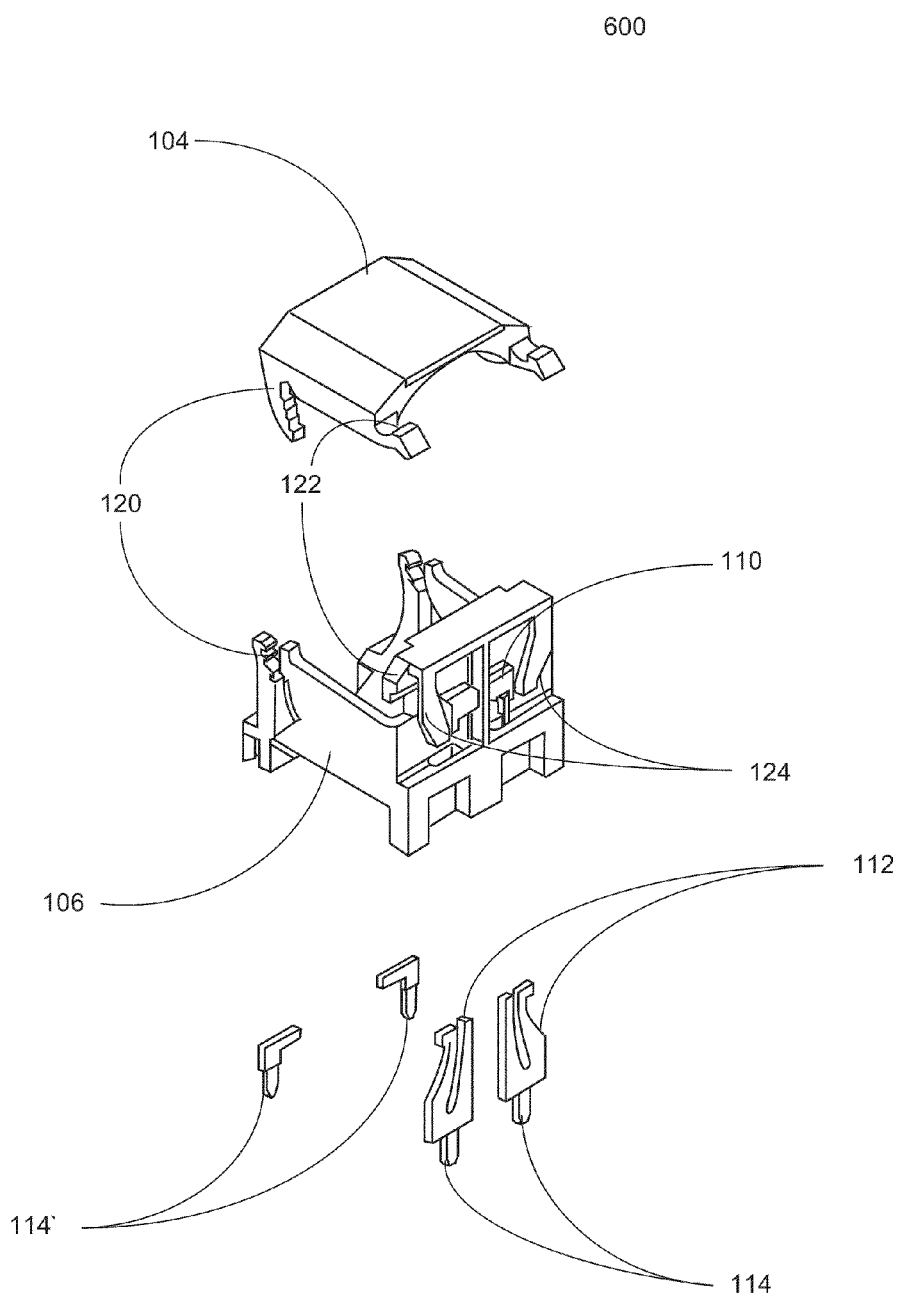
FIG. 6 is an exploded view illustration of a solderless capacitor mounting assembly in accordance with an embodiment of the present invention.

FIG. 6 is an exploded view 600 of the solderless mounting assembly 100 according to an embodiment of the present invention. The exploded view 600 illustrates the components that make up the solderless assembly 100. The exploded view 600 includes the cover portion 102, the base portion 104, the electrical contacts 112, and the connectors 114 and 114'. Also visible in FIG. 6 are the locking mechanisms 120 and 122 included on the cover portion 102 and base portion 104, and the positive stops 110.

Figure 7:
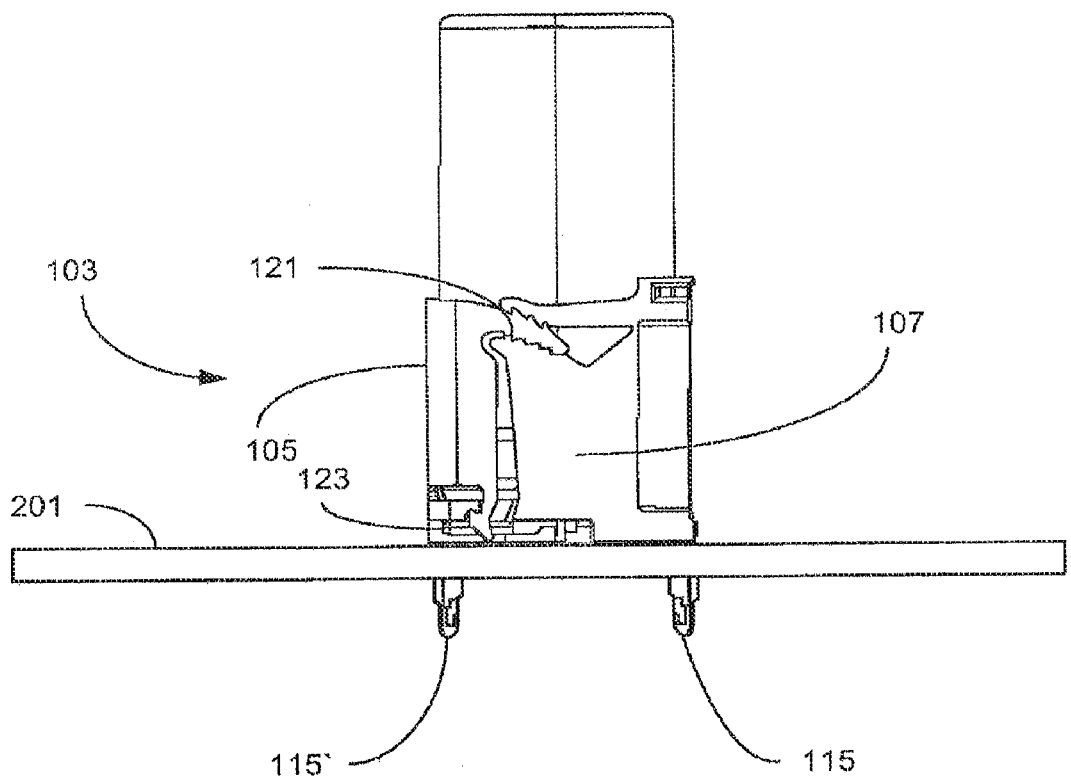
FIG. 7 is a side view of a solderless capacitor mounting assembly in accordance with an embodiment of the present invention.

FIG. 7 shows an alternative embodiment of a solderless mounting assembly 101 in accordance with the present invention. FIG. 7 shows a solderless mounting assembly 101 that is mounted vertically onto a PCB 201. The solderless mounting assembly 101 shown in FIG. 7 is similar to the solderless mounting assembly 100 shown in FIGS. 1-6 and includes a housing 103 having a cover portion 105, a base portion 107, locking mechanisms 121 and 123, and connectors 115 and 115'. Further, the assembly 101 may include any of the features described above with respect to the assembly 100.

Thus, while there have been shown, described, and pointed out fundamental novel features of the invention as applied to several embodiments, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined with regard to the claims appended hereto, and equivalents of the recitations therein.

I claim:

1. An electrical component mounting assembly for mounting a passive electrical component having an outer component surface and at least one electrical connection, the electrical component mounting assembly comprising:
    a housing having a base portion and a cover portion, the cover portion and the base portion having inner surfaces;
    at least one electrical contact mounted within the base portion of the housing and configured to contact the at least one electrical connection of the passive electrical component when the passive electrical component is mounted within the housing, the at least one conductive electrical contact including at least one conductive terminal extending from the base portion and configured for mechanical frictional engagement with a cooperative conductive opening within a printed circuit board external of the housing; and
    at least one locking mechanism operative to secure the cover portion to the base portion such that the inner surfaces of the cover portion and the base portion frictionally engage at least a portion of the outer component surface to securely retain the passive electrical component within the housing.

2. The electrical component mounting assembly as recited in claim 1, wherein the at least one locking mechanism is operative to releasably secure the cover portion to the base portion of the housing.

3. The electrical component mounting assembly as recited in claim 1, wherein the cover portion is mechanically coupled to the base portion via a hinge.

4. The electrical component mounting assembly as recited in claim 1, wherein the electrical component is a capacitor.

5. The electrical component mounting assembly as recited in claim 1, wherein the at least one locking mechanism includes one of a ratchet mechanism, a weld, a snap fit mechanism, and a coupling mechanism operative to couple the cover portion to the base portion.

6. The electrical component mounting assembly as recited in claim 1, wherein the at least one locking mechanism includes a locking cam.

7. The electrical component mounting assembly as recited in claim 1, wherein the electrical component includes a groove and at least one of the cover portion and the base portion includes a projection having a shape complementary to the groove of the electrical component, wherein the projection is disposed within the groove to secure the electrical component within the housing when the electrical component is mounted within the housing.

8. The electrical component mounting assembly as recited in claim 1, wherein the base portion and the cover portion are a single piece unitary structure.

9. The electrical component mounting assembly as recited in claim 1, wherein the base portion and the cover portion are discrete elements.

10. The electrical component mounting assembly as recited in claim 1, wherein the cover portion and the base portion are formed of a plastic.

11. The electrical component mounting assembly as recited in claim 1, wherein the assembly is configured for horizontal mounting of the electrical component with respect to the printed circuit board.

12. The electrical component mounting assembly as recited in claim 1, wherein the assembly is configured for vertical mounting of the electrical component with respect to the printed circuit board.

13. A solderless capacitor mount assembly, the assembly for mounting a generally cylindrical capacitor having an outer surface and first and second leads at one end thereof, comprising:
    a single-piece housing having a base portion and a cover portion articulated about a hinge;
    at least one connector configured to couple the base portion of the housing to a printed circuit board external to the housing via a mechanical frictional engagement;
    first and second electrical contacts configured to contact corresponding first and second leads of the generally cylindrical capacitor and configured to provide electrical connections to first and second contacts on the printed circuit board; and
    at least one locking mechanism configured to couple the cover portion and the base portion in a locked configuration, the housing configured to secure the generally cylindrical capacitor within the housing when the capacitor is disposed within the housing with the cover portion and the base portion in the locked configuration, wherein at least one of the cover portion and the base portion includes a projection having a shape complementary to a groove of the capacitor and the projection is disposed within the groove to secure the capacitor within the housing when the locking mechanism is in the locked configuration.

14. The solderless capacitor mount assembly as recited in claim 13, wherein the at least one engaging locking mechanism is configured to releasably couple the cover portion and the base portion.

15. The solderless capacitor mount assembly as recited in claim 13, wherein the at least one connector includes a press-fit connector.

16. The solderless capacitor mount assembly as recited in claim 13, wherein the first and second electrical contacts include fork-type contacts.

17. The solderless capacitor mount assembly as recited in claim 13, wherein the at least one locking mechanism includes one of a ratchet, a weld, a snap fit mechanism, and a permanent coupling mechanism.

18. The solderless capacitor mount assembly as recited in claim 13, wherein the at least one locking mechanism includes a locking cam.

19. An electrical component mounting assembly for mounting a passive electrical component having an outer surface, the assembly comprising:
    a housing having a base portion and a cover portion, the cover portion and base portion being coupled to each other and, at least one of the cover portion and the base portion including a projection have a shape complementary to a groove in the outer surface of the electrical component;
    at least one connector configured to couple the base portion of the housing to a printed circuit board external of the housing via a mechanical frictional engagement;
    at least one electrical contact configured to contact a respective at least one lead of the electrical component and provide an electrical connection to the electrical component; and
    at least one locking mechanism including a ratchet mechanism and a locking cam that is operative to lock the cover portion to the base portion in a locked configuration, the locking mechanism operable to secure the electrical component between the base portion and the cover portion with the projection disposed within the groove in the outer surface of the component to secure the electrical component within the housing when the electrical component is disposed within the housing with the cover portion and the base portion in the locked configuration.

20. The solderless capacitor mount assembly of claim 13, wherein the at least one locking mechanism is operative to secure the generally cylindrical capacitor within the housing by frictional engagement of the base portion and the cover portion with the outer surface of the generally cylindrical capacitor.

* * * * *